United States Patent [19]
Roth

[11] 4,023,098
[45] May 10, 1977

[54] NOISE BURST SOURCE FOR TRANSFER FUNCTION TESTING

[75] Inventor: Peter R. Roth, Los Altos, Calif.

[73] Assignee: Hewlett-Packard Company, Palo Alto, Calif.

[22] Filed: Aug. 27, 1975

[21] Appl. No.: 602,842

[52] U.S. Cl. .......................... 324/77 R; 324/57 PS; 324/77 G

[51] Int. Cl.² ........................... G01R 23/16

[58] Field of Search ............. 324/77 R, 77 G, 77 H, 324/78 Z, 73 R, 73 AT, 57 N, 57 PS, 57 SS, 102; 331/78

[56] References Cited

UNITED STATES PATENTS

| | | | |
|---|---|---|---|
| 2,840,308 | 6/1958 | Van Horne | 324/77 G |
| 3,102,231 | 8/1963 | Wolf | 324/77 G |
| 3,636,443 | 1/1972 | Singh | 324/73 R |
| 3,718,813 | 2/1973 | Williams, Jr. et al. | 324/57 PS |

OTHER PUBLICATIONS

E. B. Carey and R. M. Press, COMPARATIVE CIRCUIT TESTER, IBM Technical Disclosure Bulletin, vol. 16, No. 10, Mar. 1974, pp. 3151 and 3152.

*Primary Examiner*—Rudolph V. Rolinec
*Assistant Examiner*—Michael J. Tokar
*Attorney, Agent, or Firm*—Allston L. Jones; Roland I. Griffin

[57] ABSTRACT

A method and apparatus for accurately measuring the transfer function of a linear system or the linear part of a non-linear system. This is accomplished by using a spectrum estimation technique which utilizes a "transient random" stimulus consisting of a short burst of random signals applied to a system under test for a period of time that is shorter than the time used to measure a single spectrum. Thus the measurement period includes the time for the "transient random" burst and for the response of the system to substantially decya to zero. The spectrum measured over this period is used to form a first estimate of the transfer function. Other "transient random" stimuli, uncorrelated with the prior records, are then generated and the above procedure is repeated to achieve an average value for the transfer function estimate of the desired accuracy. Through the use of several "transient random" stimuli, leakage and distortion in the measurement are minimized, thus greatly improving the accuracy of the estimation technique in measuring the transfer function of the system under test.

7 Claims, 6 Drawing Figures

NOISE BURST SOURCE FOR TRANSFER FUNCTION TESTING

CROSS REFERENCE OF RELATED APPLICATION

This application is related to the copending U.S. patent application entitled "Noise Source for Transfer Function Testing", Ser. No. 555,773, filed Mar. 6, 1975, for the same assignee as this application.

BACKGROUND OF THE INVENTION

This invention is concerned generally with measurement devices, and, more particularly, with transfer function measurement devices.

Transfer, impedance, and frequency responses are terms used in describing the gain and phase response of an interconnection of physical devices as a function of frequency. These measurements are most useful in describing linear systems, but they may also be used to described a linear approximation, within a band of frequencies, to a nonlinear system. These transfer functions are conventionally measured by applying a sinusoidal stimulus at a single frequency to the system under test while observing the gain and phase relationships between the stimulus and the system response. This measurement method has certain limitations. If single frequency stimuli are applied successively, then the measurement at each frequency will take a time equal to several of the longest time constants in the measurement system or the system under test (SUT). If the SUT has any non-linearities, then the distortion components of the sine wave response will affect measurement accuracy unless they are removed by narrow band filtering methods. If a narrow band filter is used, additional errors in the measurement due to filter accuracy are introduced.

A measurement system that can determine the frequency response of the SUT at many frequencies simultaneously can improve the speed of the measurement process. Such a measurement system consists of a stimulus generator connected to the SUT to apply an input stimulus thereto, and a two-channel spectrum analyzer with the first channel measuring the spectrum ($S_x$) of the stimulus applied to the SUT and the second channel measuring the spectrum ($S_y$) of the response of the SUT. In operation, the measurement system applies a stimulus of finite length from the stimulus generator to the SUT, detects the response of the SUT, measures the spectrums $S_x$ and $S_y$, and calculates the transfer or impedance function using $S_x$ and $S_y$. If the measurement system applies a stimulus of finite length to the input of the SUT, several methods (including a digital Fourier transform) can be used to compute a response at many discrete frequencies in a period of time equal to the time needed to measure a single frequency response to a sinusoidal stimulus applied to the SUT. The measurement time may thus be reduced in proportion to the number of spectral lines that may be computed in the time needed to measure the response of the SUT to a single sinusoidal stimulus. To implement this type of measurement requires the use of a broad band stimulus generator. With a broad band stimulus generator several methods may be used to determine the transfer function of the SUT from the input and output spectrums, $S_x$ and $S_y$ respectively. The output spectrum, $S_y$, can be divided by the input spectrum, $S_x$, to form the transfer function of the SUT as shown in equation 1.

$$H(f) = \frac{S_y(f)}{S_x(f)} \tag{1}$$

A better method is to compute the cross power spectrum between the stimulus and the response of the Sut as in equation 2.

$$G_{yx}(f) = S_y(f) S_x^*(f) \tag{2}$$

The auto power spectrums of the stimulus and the response of the SUT are given in equations 3 and 4.

$$G_{xx} = S_x(f) S_x^*(f) \tag{3}$$
$$G_{yy} = S_y(f) S_y^*(f) \tag{4}$$

The asterisk in each of equations 2, 3 and 4, and in each of the following equations where it appears, indicates the complex conjugate of the so designated function. From these quotations the transfer function $H(f)$ may be computed as $$H(f) = \frac{G_{yx}(f)}{G_{xx}(f)} \tag{5}$$

If averaged values for the cross and auto power spectrums are computed from an ensemble of sampled records then the transfer and coherence functions may be determined using a least squares estimation technique where $$H(f) = \frac{\overline{G_{yx}(f)}}{\overline{G_{xx}(f)}} \tag{6}$$

is the form of the least squares estimate of the transfer function and $$\gamma^2(f) = \frac{\overline{G_{yx}(f)} \ \overline{G_{yx}(f)}^*}{\overline{G_{xx}(f)} \ \overline{G_{yy}(f)}} \tag{7}$$

is the coherence function for this estimate. The fraction of the SUT output power that is due to the SUT input power at a given frequency is represented by $\gamma^2$ and has a value between 0.0 and 1.0. The bar above the functions in these equations indicates the average value of the so designated function. The least squares estimation technique of equations (6) and (7) is simply implemented using a digital processor capable of computing a digital Fourier transform that is well known in the art. These measurement techniques are more fully described in Roth, Peter R., "Effective Measurements Using Digital Signal Analysis," *IEEE Spectrum*, pp. 62–70, Apr. 1971.

The most direct method of implementing the described measurement technique is to use a random noise stimulus which has a relatively flat spectrum over the band of frequencies being measured. A random stimulus has several important advantages in this measurement. It is easily made broad band in nature, delivering all frequencies in the band of interest. When used with the least squares technique of equations (6) and (7) the random stimulus is uncorrelated with noise and its own distortion products, and therefore yields an accurate estimation for $H(f)$ in the presence of noise and nonlinearities.

The elimination of distortion components using a random stimulus is an important result of a measurement procedure which utilizes a random stimulus that is uncorrelated between records. In a spectrum of a random signal the relation between spectral lines is random from sample record to sample record when a collection of estimates is averaged together to yield a final result. Therefore, the distortion products that fall on any component of the response spectrum are uncorrelated from record to record. However, the response at each spectral line is deterministically related to the stimulus by the transfer function being measured. The result is that when the stimulus is uncorrelated with itself over a number of records, an ensembled record average of the cross spectrum between stimulus and response will reduce both noise and nonlinearity introduced by the SUT in proportion to the number of averages used.

The limitation on the use of random noise as a stinulus is the nonperiodicity of the continuous random noise. When any continuous signal is sampled for a finite period of time the spectrum of the resultant continuous signal of a finite record length is the spectrum of the continuous signal convolved with, or smeared by, the spectrum of the window function that is, or that is derived from, a sine function (i.e. sin $x/x$). The result is that each spectral line of the resultant frequency spectrum contains components from other frequencies. The effect on the measurement is that the transfer function is not the result of a measurement at a single frequency, but a measurement that is the weighted average given by the spectrum of the window function. This is analogous to the effect that would be observed using a continuous filter of finite bandwidth to observe the random signal. This phenomenon is called leakage in the literature and is more fully described in page 45 of Bergland, G. D., "A Guided Tour of the Fast Fourier Transform," *IEEE Spectrum*, Vol. 6, pp. 41–52, July 1969.

The leakage effect due to the continuous nature of random noise can be overcome by using a periodic broad band stimulus. Pseudo random sequences are one example of a periodic broad band stimulus, and these sequences are well known in the art. (One method for generating a pseudo random sequence is discussed in the "Operating and Service Manual" for the Hewlett-Packard Noise Generator Model 3722). If the periodic stimulus has a period equal to the finite record length of the measured signal, leakage will be eliminated. In use, the periodic stimulus is applied to the SUT and allowed to repeat until the transient response from the SUT has decayed to a value small enough that the response of the SUT can be considered a periodic signal. The spectrum of tHE SUT response after the initial output transients have decayed to zero consists of a set of spectral lines apart by $\Delta f$ Hz, where $\Delta f = 1/T$ and T is the period of the signal applied to the SUT. When a finite record length of a period T is used to compute the spectrum of the stimulus and the response of the SUT, each sinc function that is centered on each frequency of the applied stimulus is not affected by other spectral lines of the stimulus. This condition exists because the zeros of the sinc function spectrum of the sampling envelope are spaced $\Delta f$ Hz apart, and all other lines of the spectrum fall on these zero points. A transfer function measured with a periodic stimulus will then measure the response of a system at each frequency with no effect from other frequencies.

The limitation of the periodic stimulus method is that different frequencies in the stimulus signal maintain a fixed relation to each other from measurement period to period. When nonlinearities are present in the SUT response, the distortion products at each frequency will maintain a fixed, correlated relation to the applied stimulus from record to record. The least squares technique will not eliminate the nonlinear components in the transfer function estimate, but will only discriminate against uncorrelated noise in the measurement. Because of the lower spectrum signal-to-noise ratio when broad band stimuli are used, distortion components in relatively linear systems can have a significant effect on measurement accuracy.

In the patent application entitled "Noise Source for Transfer Function Testing", Ser. No. 555,773, filed Mar. 6, 1975, a "periodic random" noise source for transfer function testing was described. The "periodic random" noise source provides a broad band stimulus which simultaneously supplies all frequencies in a selected band of frequencies making possible rapid transfer function measurements over the selected band of frequencies. When the "periodic random" method is combined with the transfer function estimation technique using the average cross and auto power spectrum least squares method of equation (6), the resulting transfer function estimator is unaffected by leaking and distortion to the extent desired. The "periodic random" method depends on generating a random-like signal that will repeat in a period equal in length to the period over which the spectrum of $G_{ux}$ and $F_{xx}$ are measured, so that the periodic signal thus generated will be leakage free. In certain situations, the measurement period may be so long that a circulating memory or other device used to generate the repeating random signal may not be practical. This may occur when long measurement times are used to achieve high resolution in baseband measurements or when digital filtering is employed in Band Selectable Fourier Analysis for the same purpose. The article H. Webber Mckinney, Band Selectable Fourier Analysis, Hewlett-Packard Journal, Vol. 26, No. 8, April, 1975, describes a technique for making high resolution transfer function and spectrum measurements.

SUMMARY OF THE INVENTION

In accordance with the illustrated embodiment, the invention provides a method and apparatus for measuring a transfer function of the SUT using an estimation technique. The present invention employs a stimulus which might be described as a "transient random" stimulus that eliminates leakage introduced by the use of a purely random stimulus, and distortion introduced by stimulating a non-linear system by the use of a periodic signal. Thus, it is not necessary to store a signal to be repeated with a period as long as the measurement window to minimize the leakage and distortion effects.

It is well known that a transient signal that is shorter than the period used to measure a spectrum does not suffer from the errors in measurement due to the window length known as leakage, providing the spectrum measurement is initiated simultaneously with, or prior to, the transient signal, and that the transient response of the SUT decays to nearly zero before the end of the measurement period. The present invention therefore uses a transient burst random stimulus that is shorter than the measurement window to stimulate the SUT for the first measurement of the spectra at the SUT input and output. This first measured set of spectra is used for the first estimate of the transfer function which will be unaffected by characteristic leakage of random signals since the measurement of the spectra is not complete until the response of the SUT has decayed to a level that will have only a negligible effect on the measurement accuracy.

To improve the accuracy of the measured system transfer function, additional "transient random" stimuli are used to excite the system to obtain additional transfer function estimators. Each of these additional "transient random" signals is uncorrelated with the first and other "transient random" excitation for the total set. The final transfer function estimator obtained by exciting the SUT with a number of "transient random" stimuli which are continuously averaged together results in the elimination of the effects of noise and distortion from the final estimator within the desired accuracy. Since each of the "transient random" stimuli are random and uncorrelated with each other, the noise introduced by the SUT and included in its output will be uncorrelated with the stimulus signal and will be averaged out when a sufficient number of transfer functon estimators are combined. In addition, since the "transient random" bursts are uncorrelated with each other, the distortion caused by the SUT non-linearities and included in the SUT output will be uncorrelated from record to record and will also average out. Thus, the transfer function measured from a set of estimators using "transient random" stimuli will be unaffected by system noise and distortion, and measurement errors due to leakage.

An apparatus to implement this method includes a random noise generator and a switch. The random noise generator continuously generates a random signal which is applied to the SUT as a transient burst when the switch is closed for a short period simultaneously with, or after, the start of the spectral measurement of the SUT. This apparatus can be implemented with either analog or digital components in approximately the same form.

Another method for generating a "transient random" record utilizes a computational algorithm such as the one discussed in Gold, B. and Radar, C., *Digital Processing of Signals*, McGraw-Hill, N.Y. 1969, pp. 144–146. This method is initiated by selecting a kernal that is then utilized to compute a set of random samples of the desired record length using a random number generator algorithm. After a particular random burst has been generated, a period of low logic level is added to the transient random burst to form the "transient random" stimuli. A new uncorrelated "transient random" stimuli is generated by restarting the algorithm with another selected kernal.

DESCRIPTION OF THE PREFERRED EMBODIMENT

Figure 1:
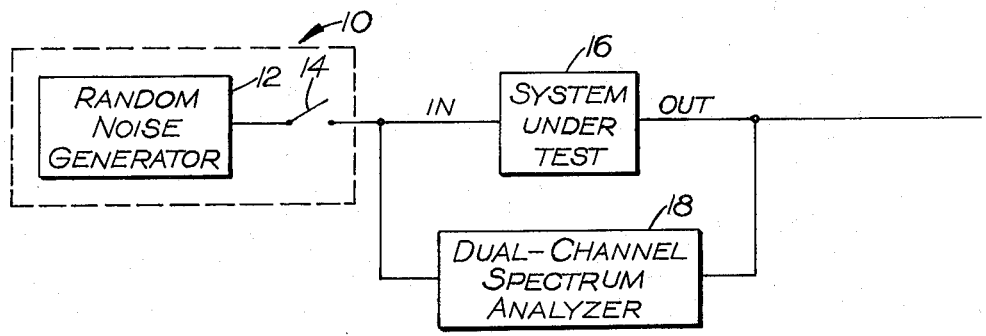
FIG. 1 is a block diagram illustrating one embodiment of the transfer function estimation technique of the present invention utilizing a dual-channel spectrum measuring device.

The embodiment of the invention illustrated in FIG. 1 includes a "transient random" stimulus generator 10, a dual-channel spectrum measuring device 18 (e.g. HewlettPackard Fournier Analyzer Model 5451), and a SUT 16. The "transient random" stimulus generator 10 includes a random noise generator 12 (e.g., a noise diode), and a switch 14. Random noise generator 12 produces either a continuous or a sampled random stimulus utilizing any one of a number of well-known techniques in the art. In this embodiment switch 14 is closed simultaneously with, or shortly after, the measurement period T is initiated and the dual-channel spectrum analyzer 18 begins the measurement of the SUT 16 input and output spectra. Switch 14 is then opened after a period T2 and considerably before the completion of the spectra measurements. The dual-channel spectrum analyzer 18 continues to make the spectra measurements until the SUT 16 response has decayed sufficiently such that the remainder of the response has only a negligible effect on the measurement accuracy. From these spectra the spectrum analyzer 18 can compute the transfer function estimator of SUT 16 or a first ensemble record of the cross and auto power spectra of the recorded signals. By computing these spectra or the transfer function of SUT 16 with a computation window that is substantially longer than the period of the "transient random" stimulus, the resultant spectra or transfer function estimator will be relatively unaffected by leakage.

The above process is then repeated using another signal record from random noise generator 12. The ensemble record computed during each signal record period is uncorrelated with the other ensemble records since each ensembled record is derived from a different uncorrelated signal record from random noise generator 12. Only the spectral components in the cross spectrum or the transfer function of SUT 16 which are a result of the linear, deterministic part of the transfer function are coherent from stimulus signal record to stimulus signal record. Thus, if a set of ensemble records, each of which has been computed from a different "transient random" stimulus of period T, are averaged together, the result will be a measurement of the system gain and phase unaffected by distortion which a periodic stimulus would introduce by leakage, and by nonlinearities. This method then will permit the measurement of the transfer function of linear systems and of the linear part of non-linear systems within a band of frequencies.

Figure 2:
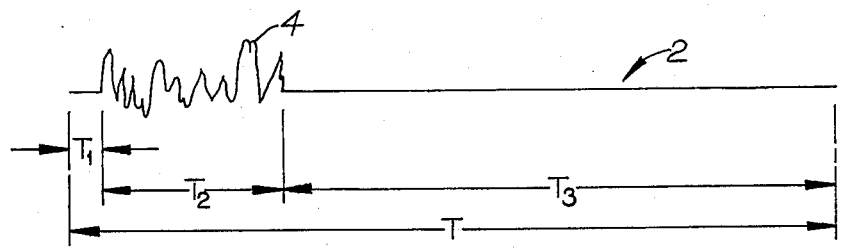
FIG. 2 is a representative drawing of a "transient random" stimulus with a spectrum measurement period T.

A typical "transient random" stimulus 2 is shown in FIG. 2, where a measurement period or computation window is T seconds in length, a transient noise burst 4 occurs during a T2 portion of the measurement period, T3 is the portion of the period that is provided for the decay of the transient response of SUT 16 in FIG. 1, and T1 is that portion of the period representing the delay between the start of the measurement period T and the closing of switch 14. It should be noted that the time period T1 is small or zero when compared to the larger time period T so that the transient noise burst 4 occurs relatively close to the beginning of the measurement period T.

Figure 3:
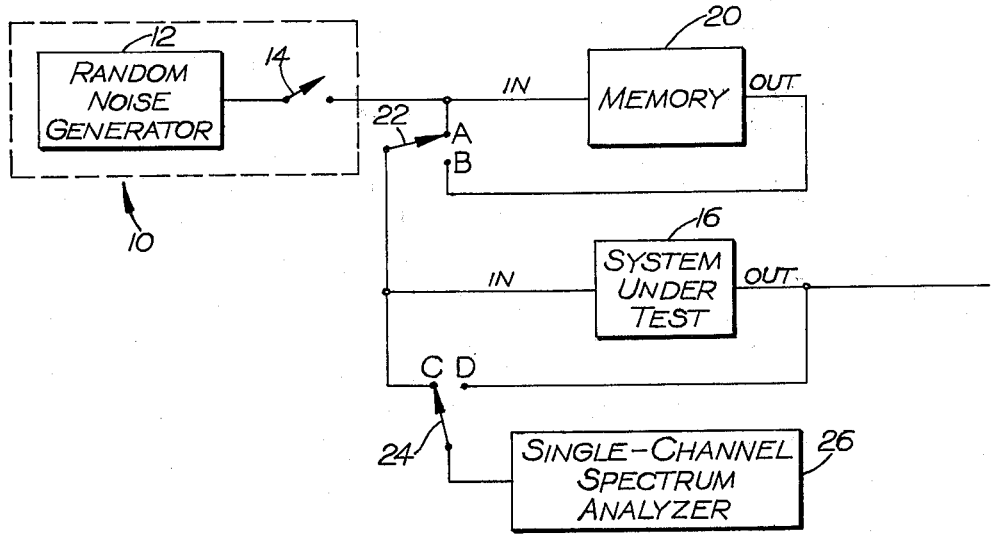
FIG. 3 is a block diagram illustrating another embodiment of the transfer function estimation technique of the present invention utilizing a one-channel spectrum measuring device.

The embodiment of the invention Illustrated in FIG. 3 includes the "transient random" stimulus generator 10 (as in FIG. 1), second and third switches 22 and 24 respectively, a one-channel spectrum analyzer 26 (e.g., Hewlett-Packard Fourier Analyzer Model 5451), a memory 20, and SUT 16. In this configuration the measurement sequence starts with switch 22 in position A and switch 24 in either position. For this discussion, assume switch 24 is initially in position C. Switch 14 is then closed for T2 seconds, applying a burst of the random stimulus from generator 12 to memory 20 and SUT 16 for a period of time which is substantially less than the measurement period T. Spectrum analyzer 26 records the spectrum of the input signal of SUT 16 for the entire period T, the switch 14, being closed simultaneously with, or after, the start of the spectral measurement, and the period T being sufficiently long so that the transient decays to nearly zero before the end of the measurement period T. At the end of the first measurement period, the position of switch 24 is moved to position D, thus initiating the measurement period for the SUT response. Switch 22 is moved to position B either simultaneously with, or after, the moving of switch 24 to reapply the identical "transient random" burst stimulus stored in memory 20 to SUT 16 with the same overall period T and intermediate periods T1, T2 and T3 as the "transient random" stimulus in the first measurement periods. Upon completion of the second measurement period, the spectra of the stimulus and response of SUT 16 can be used by spectrum analyzer 26 to form an ensemble record estimate for the transfer function or cross and auto spectra.

The method of operation of the system shown in FIG. 3 is now repeated for a new stimulus uncorrelated with prior records from the random noise generator 12. The process is repeated as many times as necessary to generate ensemble record estimates to eliminate the noise and distortion effects of SUT 16. By using the one-channel spectrum analyzer 26 the transfer function computed by using the "transient random" stimulus has no errors due to cross-talk or mismatch between the measurement channels of the spectrum measuring device. This measurement technique also provides a transfer function relatively unaffected by distortion and leakage.

The "transient random" generator 10 of FIGS. 1 and 3 can be implemented by either analog or digital components in approximately the same form. The format of the stimulus to SUT 16 can utilize a word length of from 1 bit to as many bits as desired, and as many or as few words as desired without loss of generality.

Figure 4A:
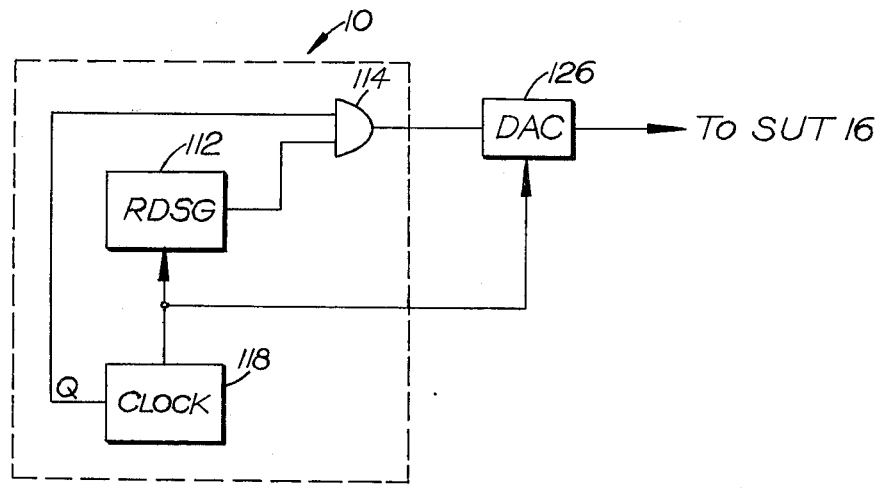
FIGS. 4a and 4b are schematic diagrams illustrating digital implementations of the preferred embodiments for generating "transient random" stimuli to the SUT.

In FIG. 4a, the "transient random" stimulus generator 10 is shown implemented digitally. This implementation of generator 10 includes a random digital sequence generator (RDSG) 112 (e.g., Hewlett-Packard Noise Generator 3722), a clock 118 and an AND gate 114. In this embodiment, RDSG 112 provides a random sequence stimulus at the rate of clock 118 by any of a number of well-known methods, as does random noise generator 12 of FIGS. 1 and 3. Gate 114 under the control of signal Q from clock 118 performs the function of switch 14. In operation, signal Q is intitially made true activating gate 114, simultaneously with, or a short period of T1 seconds after, the initiation of the measurement period of T seconds. For a first record period of T2 seconds, the random digital sequence is outputted to a digital to analog converter (DAC) 126 at the rate of clock 118 and applied to SUT 16 from DAC 126 for the measurement circuit configuration shown in FIG. 1. At the end of the random transient period of T2 seconds, Q is made false, which deactivates gate 114 and a string of zero inputs are then applied to DAC 126 which are converted to a zero signal and applied to SUT 16 for a period of T3 seconds. This combination of signals during periods T1, T2 and T3 make up the "transient random" stimulus with a total period of T seconds. The measurement of the SUT 16 signals then proceeds as described by the method illustrated in FIG. 1. To generate a second "transient random" stimulus to make additional measurements, Q is again made true for a period of T2 seconds after the initial measurement period T is complete.

Figure 4B:
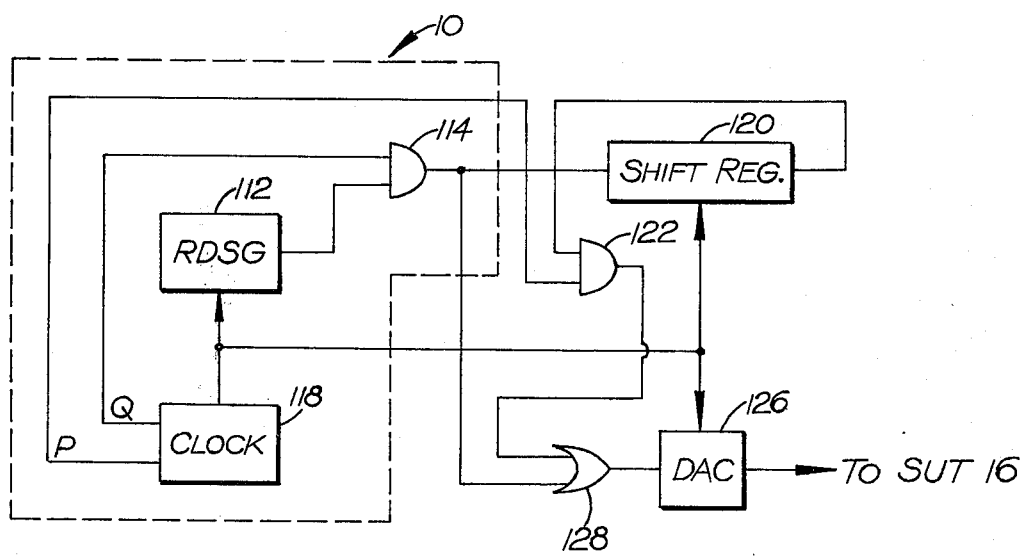

The digital circuit shown in FIG. 4b includes the implementation of stimulus generator 10 shown in FIG. 4a, a shift register 120 connected to receive the output signal of generator 10, a second AND gate 122 connected to output the signal stored in shift register 120 under the control of a signal P from clock 118, an OR gate 128 to output the applied signal from either AND gate 122 or generator 10 to a DAC 126 which applies the converted signal to SUT 16. This implementation of generator 10 functions as discussed in relation to FIG. 4a with the output signal of period T being applied simultaneously to shift register 120 and SUT 16 via DAC 126. During a second measurement period T, clock signal Q remains false and clock signal P becomes true activating AND gate 122 to apply the stimulus signal stored in shift register 120 to SUT 16 via DAC 126. The second random signal applied to SUT 16 during this second measurement period T must be identical to the signal applied to SUT 16 during the first measurement period T. This second signal can be made identical by storing the entire first "transient random" signal from generator 10 in shift register 120 and then activating AND gate 122 with signal P simultaneously with the start of the second measurement period, or by storing only the T2 portion of the first "transient random" signal from generator 10 in shift register 120 and then activating AND gate 122 with signal P for an identical T2 period after an identical T1 period following the start of the second measurement period T with a false signal being applied to DAC 126 during the T1 and T3 periods. The second technique for activating AND gate 122 permits the use of a shorter shift register 120 and can be implemented by any of a number of methods well-known in the art. During the first and second measurement periods T, the measurements of the SUT 16 signals proceed as described by the method illustrated in FIG. 3. To generate a different "transient random" stimulus to make additional measurements, Q is again made true for a period of T2 seconds and the above-described procedure is repeated.

DAC 126 can be implemented by any known method including a transversal tapped filter which utilizes a shift register and a multi-tapped resistor. RDSG 112 can be implemented in a one-bit wide format and used in conjunction with a transversal filter to obtain a more continuous stimulus signal.

Figure 5:
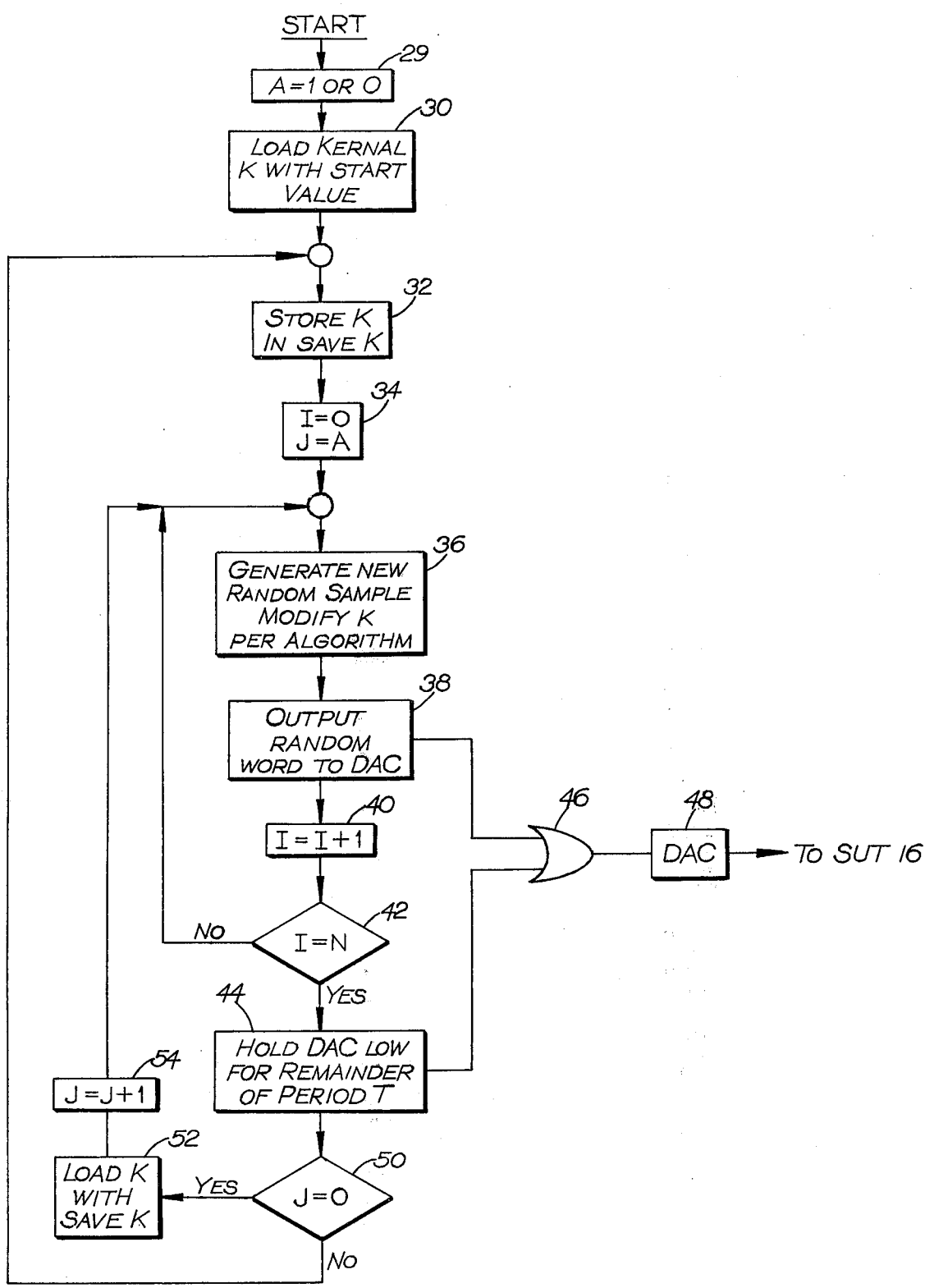
FIG. 5 is a flow diagram illustrating a computational implementation of the preferred embodiments for generating "transient random" stimuli to the SUT.

FIG. 5 illustrates a computational method for generating a transient random stimulus signal. The computation is initiated by setting a flag A to 0 or 1 for a single-channel or a dual-channel spectrum analyzer, respectively, whichever is to be used (Block 29), and selecting a kernal, K, and loading the selected value of K into the computational means (Block 30). The value of K is next stored in a memory location as indicated by SAVE K (block 32) and index variables I and J are set to zero and A, respectively, (Block 34), where index I represents the number of sample points in the "transient random" burst and has a maximum value of N and J is a flag used to determine if the "transient random" burst is to be repeated to enable the spectrum analyzer being utilized to make a complete measurement.

The next step in the computation starts with the kernal to generate a "transient random" sample point, with a selected number of bits, utilizing an algorithm such as the Gold and Radar Algorithm as described and referenced in the Summary of the Invention (Block 36). This "transient random" sample point is then outputted (Block 38) to SUT 16 via OR gate 46 and DAC 48. Index I is next advanced by 1 (Block 40) and tested against its maximum value N (Block 42).

If I is less than N, the algorithm (Block 36) is restarted to generate another sample of the stimulus. The functions of blocks 38 through 42 are then repeated. If I equals N (Block 42), then the "transient random" burst is complete and the low logic level tail (period T3) of the stimulus is begun.

The low logic level of the stimulus is generated by the computational means for a period of T3 seconds (Block 44) and is outputted to SUT 16 via OR gate 46 and DAC 48. After the expiration of period T3, flag J is tested against 0 (Block 50).

If J equals 0, the value stored in memory location SAVE K is reloaded into K (Block 52), the value of flag J is advanced by 1 (Block 54) and the function of blocks 36 through 50 are repeated to output the same "transient random" stimulus as previously to SUT 16 via OR gate 46 and DAC 48. If J is not equal to 0, since A was initially set at 1, or if the "transient random" stimulus has been repeated once, a new "transient random" stimulus which is uncorrelated with prior records is generated by starting with the last kernal, K, generated previously (Block 36), after storing that value of K in memory location SAVE K (Block 32), and resetting index I to 0 and flag J to A (Block 34).

I claim:
1. A method of measuring transfer functions of a system under test, the method comprising the steps of:
 a. generating and applying a transient random stimulus of period T seconds in length to the system under test, this step including the steps of:
  generating a random stimulus; and
  applying the random stimulus to the system under test for a period of T2 seconds during the initial portion of the T second period, T2 being a period that is substantially shorter than the T second period, and T being a period that is sufficiently long to allow the transient response of the system under test to the T2 second random stimulus to decay substantially to zero during the T second period;
 b. recording the transient random stimulus generated in step (a) during its application to the system under test;
 c. measuring the spectrum of the transient random stimulus during its T second period;
 d. applying the recorded transient random stimulus to the system under test after the T second period of the transient random stimulus generated in step (a) has been completed;
 e. measuring the spectrum of the response of the system under test during the T second period of the transient random stimulus applied thereto in step (d);
 f. computing a first estimate of the transfer function of the system under test from the two measured spectra;
 g. repeating steps (a) through (f) to obtain an additional estimate of the transfer function of the system under test using a transient random stimulus that is uncorrelated with previous stimuli;
 h. averaging together each additional estimate and the average of the previously obtained estimates of the transfer function of the system under test; and
 i. repeating steps (g) and (h) a sufficient number of times to obtain an average estimate of the transfer function of the system under test within a selected accuracy.

2. A method according to claim 1 wherein the spectra of the stimulus and response of the system under test are measured utilizing a single-channel spectrum measuring device.

3. A method of measuring transfer functions of a system under test, the method comprising the steps of:
 a. generating and applying a transient random stimulus of period T seconds in length to the system under test, this step including the steps of:
  generating a random stimulus; and
  applying the random stimulus to the system under test for a period of T2 seconds during the initial portion of the T second period, T2 being a period that is substantially shorter than the T second period, and T being a period that is sufficiently long to allow the transient response of the system under test to the T2 second random stimulus to decay substantially to zero during the T second period;
 b. measuring the spectra of the transient random stimulus and the transient response of the system under test simultaneously during the T second period of the transient random stimulus;
 c. computing a first estimate of the transfer function of the system under test from the two measured specta;
 d. repeating steps (a) through (c) to obtain an additional estimate of the transfer function of the system under test using a transient random stimulus that is uncorrelated with previous stimuli;
 e. averaging together each additional estimate and the average of the previously obtained estimates of the transfer function of the system under test; and
 f. repeating steps (d) and (e) a sufficient number of times to obtain an average estimate of the transfer function of the system under test within selected accuracy.

4. A method according to claim 3 wherein the spectra of the stimulus and response of the system under test are simultaneously measured utilizing a dual-channel spectrum measuring device.

5. An apparatus for generating a transient random stimulus for application to a system under test comprising:
 computational means for generating a series of random sample points to form a random burst stimulus of T2 seconds in length from a kernal during the initial portion of a measurement period T seconds in length, T2 being a period that is substantially shorter than the measurement period T; and an output means responsive to the random burst stimulus for applying that stimulus to the system under test;

said computational means also being connected to selectively restore a selected kernal and to initiate the generation of an identical random burst stimulus a single time, after which a next kernal is selected to generate a random burst stimulus that is uncorrelated with all other stimuli after the last preceding T second measurement period is complete, and said measurement period T being sufficiently long to allow the transient response of the system under test to the transient random stimulus to decay substantially zero during the T second measurement period.

6. An appararus as in claim 5 wherein the computational means comprises a digital computer.

7. An apparatus as in claim 6 wherein the output means comprises digital to analog converter means for applying an analog stimulus to the system under test.

* * * * *

UNITED STATES PATENT AND TRADEMARK OFFICE
CERTIFICATE OF CORRECTION

PATENT NO. : 4,023,098
DATED : May 10, 1977
INVENTOR(S) : Peter R. Roth

It is certified that error appears in the above-identified patent and that said Letters Patent are hereby corrected as shown below:

In the Abstract, line 11, delete "decya" and insert -- decay --;

Column 3, line 12, delete "ensembled" and insert -- ensemble --; line 17, delete "stinulus" and insert -- stimulus --; line 51, delete "tHE" and insert -- the --;

Column 4, line 29, delete "F" and insert -- G --;

Column 6, line 40, delete "ensembled" and insert -- ensemble --.

*Signed and Sealed this*

*twenty-third* Day of *August 1977*

[SEAL]

Attest:

RUTH C. MASON
*Attesting Officer*

C. MARSHALL DANN
*Commissioner of Patents and Trademarks*